United States Patent [19]

Morishita

[11] Patent Number: 5,529,956
[45] Date of Patent: Jun. 25, 1996

[54] MULTI-LAYER WIRING STRUCTURE IN SEMICONDUCTOR DEVICE AND METHOD FOR MANUFACTURING THE SAME

[75] Inventor: Yasuyuki Morishita, Tokyo, Japan

[73] Assignee: NEC Corporation, Japan

[21] Appl. No.: 314,437

[22] Filed: Sep. 28, 1994

Related U.S. Application Data

[63] Continuation of Ser. No. 917,773, Jul. 21, 1992, abandoned.

[30] Foreign Application Priority Data

Jul. 23, 1991 [JP] Japan .................................. 3-206564

[51] Int. Cl.⁶ .................................................. H01L 21/44
[52] U.S. Cl. ........................... 437/195; 437/228; 437/245
[58] Field of Search ................................... 257/752, 758, 257/759, 770, 774, 773, 747, 776; 437/195, 192, 235, 245, 228 CON

[56] References Cited

U.S. PATENT DOCUMENTS

| | | | |
|---|---|---|---|
| 3,507,756 | 4/1970 | Wenger | 204/15 |
| 4,898,841 | 2/1990 | Ho | 257/752 |
| 4,977,105 | 12/1990 | Okamoto et al. | 437/190 |
| 5,098,860 | 3/1992 | Chakravorty et al. | 437/195 |
| 5,209,817 | 5/1993 | Ahmad et al. | 156/643 |
| 5,254,498 | 11/1993 | Sumi . | |
| 5,262,352 | 11/1993 | Woo et al. . | |
| 5,312,773 | 5/1994 | Nagashima . | |
| 5,358,621 | 11/1994 | Oyama . | |

Primary Examiner—George Fourson
Assistant Examiner—C. Everhart
Attorney, Agent, or Firm—Laff, Whitesel, Conte & Saret, Ltd.

[57] ABSTRACT

After an interlayer insulator film is deposited on a wiring conductor formed on a semiconductor device element and is then planarized, a first conducting film and a first insulating film are deposited in the named order. Thereafter, a through hole is formed, and a second conducting film and a second insulating film are deposited and then etched back so that these films remain on only a side wall surface of the through hole. Furthermore, the through hole is filled with a metal plating, and then, the etching-back is performed again. Thereafter, an upper level wiring conductor is plating-grown by supplying an electric current to the first conducting film, and the second conducting film remaining on the side wall surface and the lower level wiring conductor.

9 Claims, 4 Drawing Sheets

MULTI-LAYER WIRING STRUCTURE IN SEMICONDUCTOR DEVICE AND METHOD FOR MANUFACTURING THE SAME

This application is a continuation of application Ser. No. 07/917,773, filed Jul. 21, 1992, abn.

BACKGROUND OF THE INVENTION

1. Field of the Invention

The present invention relates to a semiconductor device and a method for manufacturing the same, and more specifically to a process for forming a multi-layer wiring.

2. Description of Related Art

In a typical conventional process of manufacturing a semiconductor device, a multi-layer wiring formation using a plating method has been performed for example as follows:

A lower level wiring conductor is formed on a field insulator film formed on a semiconductor substrate, and then, an interlayer insulating film is formed. Thereafter, a through hole is formed for connecting between the lower level wiring conductor and a possible upper level wiring conductor. In the case of an electroplating, a conducting film is formed as an electric current supplying layer.

In addition, a photoresist is coated on the conducting film, and then, patterned into a desired shape by a photolithography. By the electroplating process, an upper level wiring conductor is formed on a portion of the conducting film that is not covered by the photoresist.

Thereafter the photoresist is removed, and an exposed portion of the conducting film is removed, so that a desired wiring conductor is obtained.

In the above mentioned conventional multi-layer wiring forming process using the electroplating, the shape of the upper level wiring conductor becomes concave or recessed to reflect the shape of the lower level wiring conductor and the shape of the through hole portion for connecting between the upper level wiring conductor and the lower level wiring conductor. Therefore, if the number of the conductor levels becomes large in the multilayer wiring structure, it becomes difficult to planarize, and in addition, it is also difficult to form a wiring conductor in the uppermost level.

SUMMARY OF THE INVENTION

Accordingly, it is an object of the present invention to provide a semiconductor device and a method for manufacturing the same, which have overcome the above mentioned defect of the conventional one.

Another object of the present invention is to provide a multi-layer wiring structure for a semiconductor device in which the shape of the upper level wiring conductor is not limited by the lower level wiring conductor and the shape of the through hole, and therefore, the upper level wiring conductor is relatively planar.

Still another object of the present invention is to provide a method for forming a multi-layer wiring structure, which can form a relatively planar upper level wiring conductor without being limited in shape by the lower level wiring conductor and the shape of the through hole.

The above and other objects of the present invention are achieved in accordance with the present invention by a multi-layer wiring structure in a semiconductor device, comprising a lower level wiring conductor of a desired pattern formed on a substrate, an interlayer insulating film formed on the substrate to completely cover the lower level wiring conductor, the interlayer insulating film having a thickness sufficiently larger than that of the lower level wiring conductor, the interlayer insulating film having a through hole formed therethrough so as to reach an upper surface of the lower level wiring conductor, a first conducting film coated on a side wall surface of the through hole, an insulating film coated on the first conducting film, a second conducting film coated on the interlayer insulating film so as to surround the first conducting film, an electric conductor filled in the through hole in such a manner that one planar surface is constituted of an upper surface of the second conducting film, an upper end surface of the first conducting film, an upper end surface of the insulating film, and an upper surface of the electric conductor filled in the through hole, and an upper level wiring conductor formed on the planar surface so that the upper level wiring conductor is electrically connected to the lower level wiring conductor through the electric conductor filled in the through hole.

According to another aspect of the present invention, there is provided a method for manufacturing a semiconductor device comprising:

depositing an interlayer insulating film to completely cover a lower level wiring conductor of a desired pattern on a substrate, and planarizing the deposited interlayer insulating film;

forming a first conducting film and a first insulating film on the planarized interlayer insulating film in the named order;

forming a through hole by selectively removing the first insulating film, the first conducting film and the interlayer insulating film at a position where the lower level wiring conductor is to be connected to a possible upper level wiring conductor;

forming a second conducting film and a second insulating film, in the named order, to cover the first insulating film and an inner surface of the through hole;

etching back the second insulating film and the second conducting film so that the second insulating film and the second conducting film remain on only a side wall surface of the through hole;

performing an electroplating process by supplying an electric current to the first conducting film, the second conducting film remaining on the side wall of the through hole and the lower level wiring conductor, so that an electrically conducting material is filled in the inside of the through hole to substantially the same height as a level of the first conducting film;

etching back the first insulating film and a portion of the second conducting film and the second insulating film remaining on the side wall of the through hole until a surface of the first conducting film is exposed, so that a planarized surface is formed of the first conducting film, upper end portions of the second conducting film and the second insulating film remaining on the side wall of the through hole, and an upper surface of the electrically conducting material filled in the through hole;

locating a photoresist on the planarized surface other than a place where a possible upper level wiring conductor is to be formed;

performing an electroplating process by supplying an electric current to the first conducting film, the second conducting film remaining on the side wall of the through hole, the lower level wiring conductor and the electrically conducting material filled in the through hole, so that an upper level level wiring conductor is formed on at least the electrically conducting material filled in the through hole and a portion the first conducting film not covered by the photoresist; and removing the photoresist and the first conducting film other than a portion on which the upper level wiring conductor was formed.

The above and other objects, features and advantages of the present invention will be apparent from the following description of preferred embodiments of the invention with reference to the accompanying drawings.

DESCRIPTION OF THE PREFERRED EMBODIMENTS

Now, the present invention will be described with reference to the accompanying drawings.

FIGS. 1A to 1G illustrate, in the order of steps, various steps of a first embodiment of the method in accordance with the present invention method for forming the multi-layer wiring structure for use in a semiconductor device.

Figure 1A:
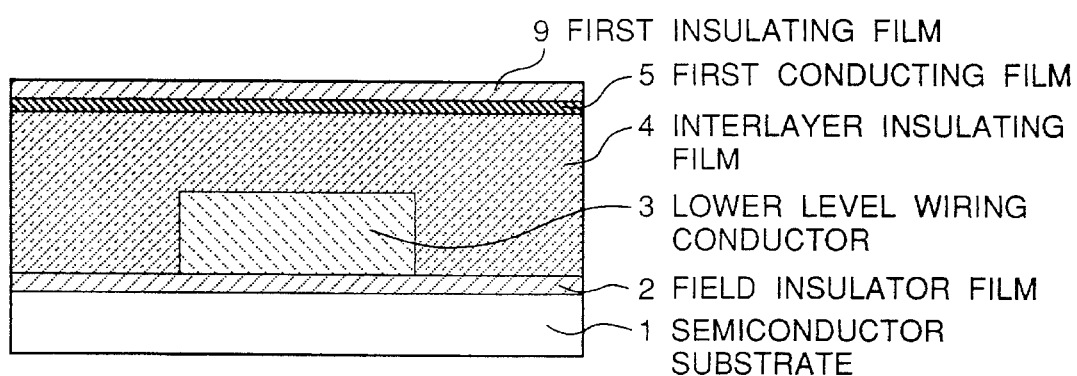
FIGS. 1A to 1G are sectional views illustrating, in the order of steps, various steps of a first embodiment of the method in accordance with the present invention method for forming the multi-layer wiring structure for use in a semiconductor device.

As shown in FIG. 1A, a semiconductor substrate 1, on which semiconductor circuits elements are formed, is isolated with a field insulator film 2, and a gold wiring conductor of a desired pattern is formed on the field insulator film 2 by an electroplating process, so as to from a lower level wiring conductor 3.

An interlayer insulting film 4 is formed on the lower level wiring conductor 3, and then, is planarized. For example, this interlayer insulting film 4 can be formed by growing a silicon oxide film by a CVD process, and then, by spin-coating a polyimide layer, and by sintering the coated polyimide layer.

On the planarized interlayer insulating film 4, a first conducting film 5 is formed by sputtering titanium or alloy of titanium or the other materials so as to have a thickness of about 0.1 μm. Thereafter, a first insulating film 9 is formed by depositing a silicon oxynitride film by a CVD process so as to have a thickness of about 0.1 μm to 0.2 μm.

Figure 1B:
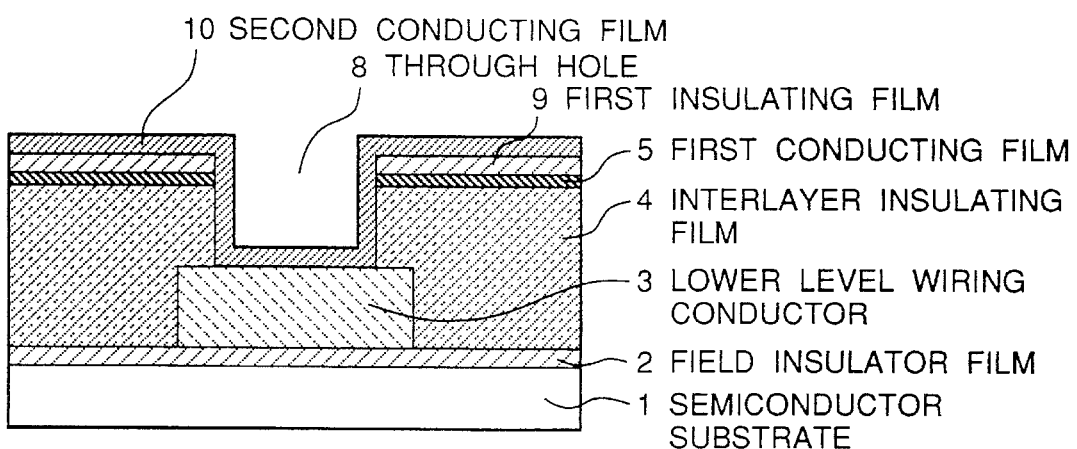

As shown in FIG. 1B, a through hole 8 of a desired size is formed at a position where it is desired to connect between the lower level wiring conductor 3 and a possible upper level wiring conductor, and then, a second conducting film 10 is formed to coat the overall surface by sputtering titanium or alloy of titanium or the other materials so as to have a thickness of about 0.1 μm The through hole 8 can be formed by, for example, forming a photoresist on all places other then the position where the through hole is to be formed, removing the first insulating film 9 and the first conducting film 5 by a reacting ion etching using for example a $CF_4$ gas, and then, removing the interlayer insulating film 4 by a reacting ion etching using a $CF_4$ gas or an $O_2$ gas or the like.

After the through hole is formed, the remaining photoresist is removed by an organic solvent. Thereafter, the second conducting film 10 is deposited as mentioned above.

Figure 1C:
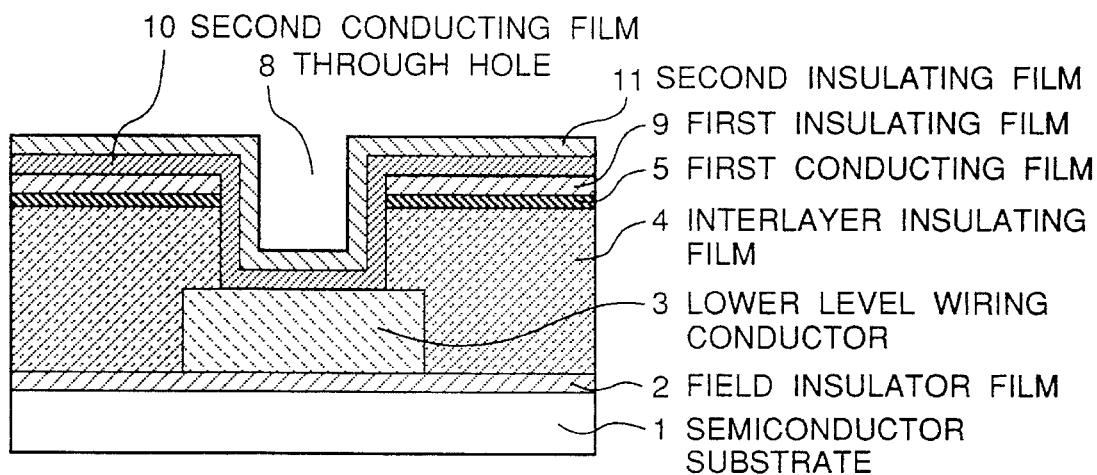

As shown in FIG. 1C, on the deposited conducting film 10, a second insulating film 11 is formed by depositing a silicon oxynitride film by a CVD process so as to have a thickness of about 0.1 μm.

Figure 1D:
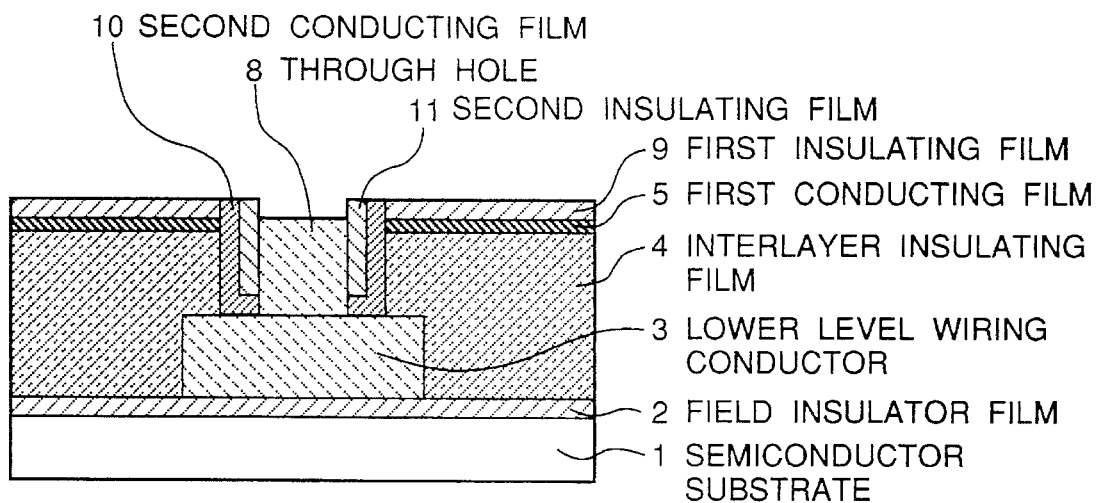

As shown in FIG. 1D, the reactive ion etching is performed using the $CF_4$ gas until the first insulating film 9 is exposed, so that the second conducting film 10 and the second insulating film 11 remain only on a side wall surface of the through hole.

With the electroplating process, gold is plating-grown in the through hole 8 until the grown gold reaches the same height as a level of a surface of the first conducting film 5. At this process, an electric current for the electroplating is supplied to the first conducting film 5, the second conducting film and the lower level wiring conductor 3.

Figure 1E:
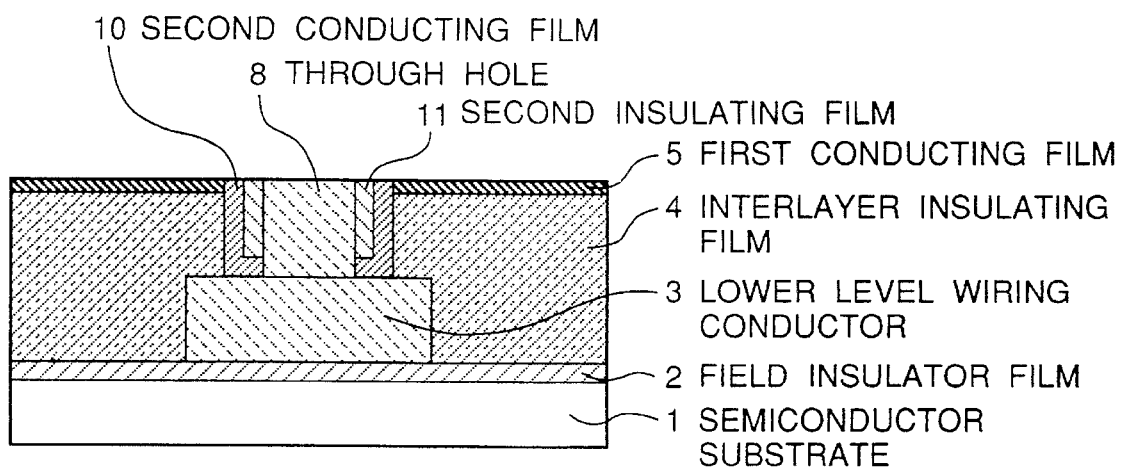

As shown in FIG. 1E, after the through hole 8 is filled with the gold plating, a portion of the second insulating film 11, a portion of the second conducting film 10 and the first insulating film 9 are removed by the reacting ion etching using the $CF_4$ gas, so that a planarized surface is obtained.

Figure 1F:
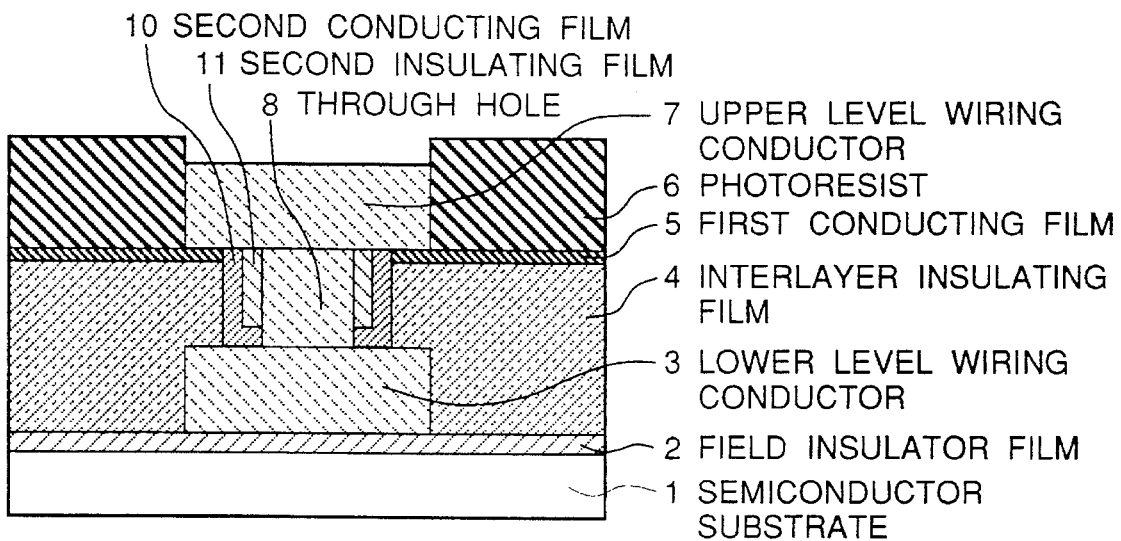

As shown in FIG. 1F, a photoresist 6 is formed on places other than a place where an upper level wiring conductor is to be formed, and an upper level wiring conductor 7 is grown by a gold plating, by supplying an electric current for electroplating to the first conducting film 5, the second conducting film 10, the lower level wiring conductor 3, and the gold within the through hole 8.

Figure 1G:
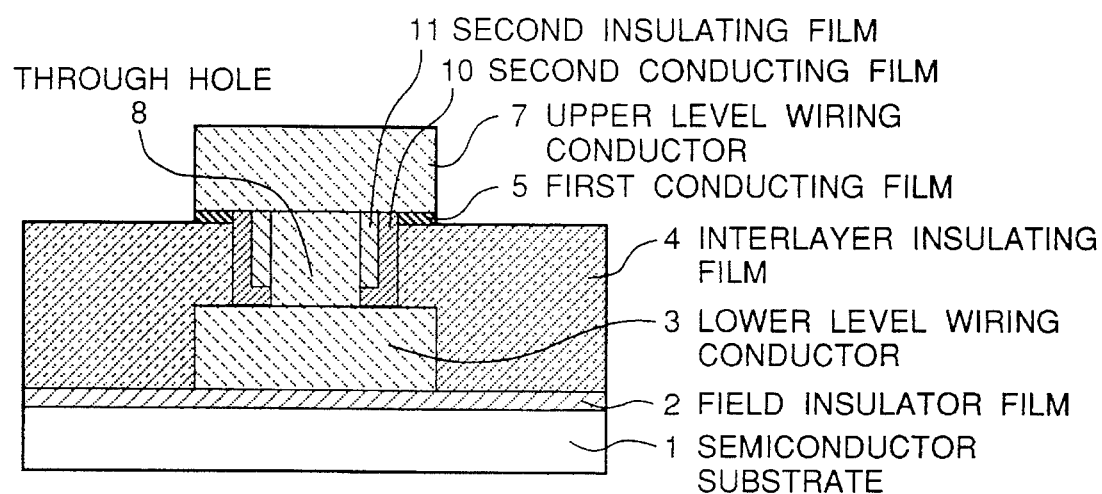

As shown in FIG. 1G, after the photoresist is removed, the first conducting film 5 is selectively removed by an ion milling using an argon gas. Thus, the present invention is realized.

Thus, the semiconductor device in accordance with the present invention has the structure as shown in FIG. 1G. Namely, the multi-layer wiring structure in accordance with the present invention for the semiconductor device comprises the semiconductor substrate 1, the field insulator film 2 formed on the semiconductor substrate 1, the lower level wiring conductor 3 in the desired pattern formed on the field insulator film, and the interlayer insulating film 4 formed on the field insulator film 2 to completely cover the lower level wiring conductor 3. The interlayer insulating film 4 has a thickness sufficiently larger than that of the lower level wiring conductor 3. The interlayer insulating film also has the through hole 8 formed therethrough so as to reach an upper surface of the lower level wiring conductor 3. The conducting film 10 IS coated on the side wall surface of the through hole 8, and the insulating film 11 is coated on the conducting film 10. In addition, the conducting film 5 is coated on the interlayer insulating film 4 so as to surround the conducting film 10. The electric conductor material is filled in the through hole 8 in such the manner that one planar surface is constituted of an upper surface of the conducting film 5, an upper end surface of the conducting film 10, an upper end surface of the insulating film 11, and an upper surface of the electric conductor material filled in the through hole 8. The upper level wiring conductor 7 is formed on the planar surface so that the upper level wiring conductor 8 is electrically connected to the lower level wiring conductor 3 through the electric conductor material filled in the through hole 8.

In other words, the through hole 8 in the form of a recessed groove is perforated through the interlayer insulating film 4 for separating the upper level wiring conductor 7 and the lower level wiring conductor 3 from each other, so as to reach a desired position of the lower level wiring conductor 3, and the inside of the through hole 8 in the form of a recessed groove is filled with an electric conductor until the filled conductor reaches a height which is substantially the same level as the surface of the interlayer insulating film 4, and in addition, the upper level wiring conductor 7 is formed on the interlayer insulating film 4 and on the conductor filled in the inside of the through hole 8.

Figure 2:
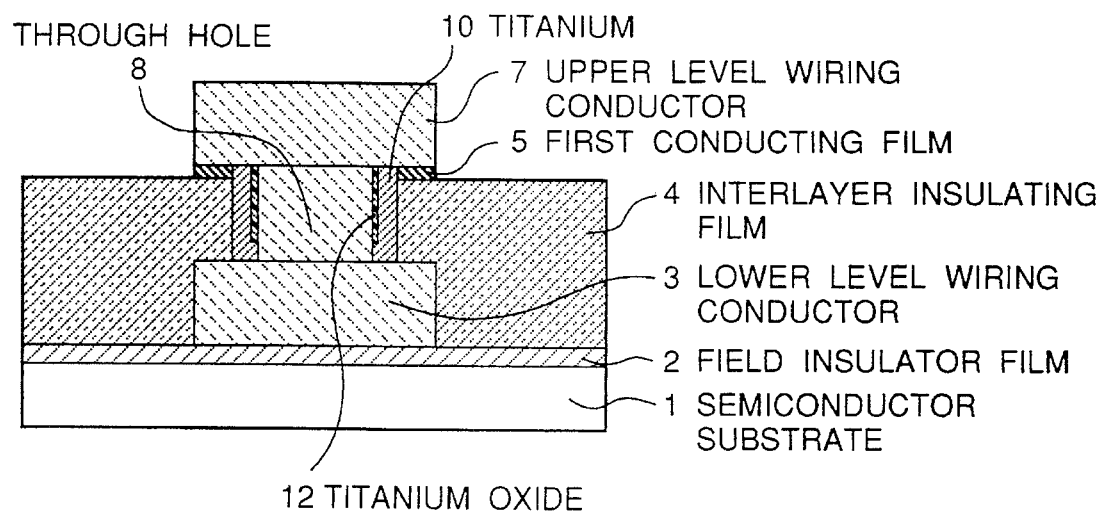
FIG. 2 is a sectional view illustrating a second embodiment of the multi-layer wiring structure in accordance with the present invention for use in a semiconductor device.

FIG. 2 illustrates a second embodiment of the present invention. In this second embodiment, only the surface of the titanium constituting the second conducting film 10 is oxidized to form an insulating film, by performing a heat-treating at 300° C. to 400° C. in oxygen atmosphere, in place of depositing the second insulating film 11 in the first embodiment.

In this embodiment, it is possible to omit the step of depositing the insulating film by the CVD process, and also, it is possible to thin the insulating layer. Therefore, it is possible to reduce the through hole 8 in size.

As mentioned above, according to the present invention, the through hole filling and the upper level wiring conductor formation are separately performed by different plating processes, respectively. Therefore, the through hole filling conductor is plating-grown from the surface of the lower level wiring conductor within the through hole, and accordingly, the through hole is compactly filled with the plating metal, with no void at a corner of the through hole.

In addition, since the upper level wiring conductor is plating-grown after the planarization, the shape of the upper level wiring conductor is not limited by the lower level wiring conductor and the shape of the through hole, and therefore, the upper level wiring conductor is relatively planar since it has only the step on the order of a few hundreds angstroms.

The invention has thus been shown and described with reference to the specific embodiments. However, it should be noted that the present invention is in no way limited to the details of the illustrated structures but changes and modifications may be made within the scope of the appended claims.

I claim:

1. A method of manufacturing a semiconductor device comprising:

depositing an interlayer insulating film to completely cover a lower level wiring conductor of a desired pattern on a substrate, and planarizing the deposited interlayer insulating film;

forming a first conducting film and a first insulating film on the planarized interlayer insulating film in the named order;

forming a through hole by selectively removing said first insulating film, said first conducting film and said interlayer insulating film at a position where an upper surface of said lower level wiring conductor is exposed within said through hole so that it may be connected to a possible upper level wiring conductor;

forming a second conducting film and a second insulating film, in the named order, to cover said first insulating film and an inner surface of said through hole including said exposed upper surface of said lower level wiring conductor so that said first conducting film is electrically connected to said lower level wiring conductor through said second conducting film thus formed;

etching back said second insulating film and said second conducting film so that said second insulating film and said second conducting film remain on only a side wall surface of said through hole;

performing an electroplating process by supplying an electric current through said first conducting film and said second conducting film remaining on said side wall of said through hole to said lower level wiring conductor, so that an electrically conductive metallic material is grown by electroplating onto said exposed upper surface of said lower level wiring conductor until said electrically conducting metallic material fills the inside of said through hole to substantially the same height as a level of said first conducting film;

etching back said first insulating film and a portion of said second conducting film and said second insulating film remaining on said side wall of said through hole until a surface of said first conducting film is exposed, so that a planarized surface is formed of said first conducting film, upper end portions of said second conducting film and said second insulating film remaining on said side wall of said through hole, and an upper surface of said electrically conducting material filled in said through hole;

locating a photoresist on said planarized surface at a location other than at a place where a possible upper level wiring conductor is to be formed;

performing an electroplating process by supplying an electric current through said first conducting film, said second conducting film remaining on said side wall of said through hole, and said lower level wiring conductor to said electrically conducting metallic material filled in said through hole, so that an upper level wiring conductor is grown by electroplating on at least said electrically conducting material filled in said through hole and a portion said first conducting film not covered by said photoresist; and removing said photoresist and said first conducting film other than a portion on which said upper level wiring conductor was formed.

2. A method claimed in claim 1 wherein said formation of said second conducting film and said second insulating film is performed by sequentially depositing said second conducting film and said second insulating film.

3. A method claimed in claim 1 wherein said formation of said second conducting film and said second insulating film is performed by depositing a metal layer as said second conducting film and then oxidizing a surface of said metal layer so as to form a surface oxidized film as said second insulating film.

4. A method claimed in claim 3 wherein said first conducting film and said second conducting film are formed of titanium, respectively.

5. A method claimed in claim 1 wherein said formation of said interlayer insulating film is performed by growing a silicon oxide film by a CVD process, and then, by spin-coating a polyimide layer, and by sintering the coated polyimide layer.

6. A method claimed in claim 1 wherein said first insulating film and said second insulating film are formed by depositing a silicon oxynitride film by a CVD process, respectively.

7. A method of manufacturing a multi-layer wiring structure in a semiconductor device, comprising the steps of:

forming a lower level wiring conductor of a desired pattern on a semiconductor substrate;

forming an interlayer insulating film on said substrate, said interlayer insulating film completely covering said lower level wiring conductor with a film thickness which is more than the thickness of said lower level wiring conductor;

forming a through hole in said interlayer insulating film, said through hole reaching an upper surface of said lower level wiring conductor so that an electrical connection may be made to said upper surface via said through hole;

coating a side wall surface of said through hole with a first conducting film, said coating having a portion extending horizontally inwardly along a bottom surface of said through hole;

coating said first conducting film with a vertical insulating film, said vertical insulating film coating having an inside surface which is coplanar with an end surface of said horizontal inwardly extending portion of said first conducting film so that a single planar inside surface is formed by said horizontal inwardly extending portion of said first conducting film and said vertical insulating film;

coating a second conducting film on said interlayer insulating film and surrounding an upper end portion of said first conducting film and filling in said through hole with an electric conductor by an electroplating process, said electroplating process occurring in response to a supplying of an electrical current through said first conducting film, said second conducting film remaining on said side wall of said through hole and extending to said lower level wiring conductor so that an electrically conductive metallic material is grown by said electroplating process until said metallic material fills the inside of said through hole to a level which is substantially the same height as a level of said first conductive film, one planar surface being formed on an upper surface of said second conducting film, an upper end surface of said first conducting film, an upper end surface of said vertical insulating film, and an upper surface of said metallic material which fills in said through hole; and forming an upper level wiring conductor on said planar surface so that said upper level wiring conductor is electrically connected to said lower level wiring conductor by said electric conductor filling said through hole.

8. A method of manufacturing a multi-layer wiring structure as claimed in claim 7 wherein said vertical insulating film is a surface oxidized film of material forming said first conducting film.

9. A method of manufacturing a multi-layer wiring structure claimed in claim 8 wherein said first conducting film is formed of titanium, and said vertical insulating film is formed of titanium oxide.

* * * * *